(12) United States Patent
Kaneko et al.

(10) Patent No.: US 8,974,852 B2
(45) Date of Patent: Mar. 10, 2015

(54) METHOD OF MANUFACTURING LIGHT-EMITTING DEVICE WITH FLUORESCENT LAYER

(75) Inventors: Kei Kaneko, Odawara (JP); Naomi Shida, Tokyo (JP); Masahiro Yamamoto, Kawasaki (JP); Yasushi Hattori, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1023 days.

(21) Appl. No.: 13/053,922

(22) Filed: Mar. 22, 2011

(65) Prior Publication Data

US 2011/0171761 A1 Jul. 14, 2011

Related U.S. Application Data

(62) Division of application No. 11/348,410, filed on Feb. 7, 2006, now Pat. No. 7,932,666.

(30) Foreign Application Priority Data

Jul. 4, 2005 (JP) ................................. 2005-195191

(51) Int. Cl.
| | | |
|---|---|---|
| H01L 33/50 | (2010.01) | |
| C09K 11/77 | (2006.01) | |
| H05B 33/10 | (2006.01) | |
| H05B 33/14 | (2006.01) | |
| H01L 33/20 | (2010.01) | |

(52) U.S. Cl.
CPC .......... *H01L 33/505* (2013.01); *C09K 11/7734* (2013.01); *C09K 11/7774* (2013.01); *H05B 33/10* (2013.01); *H05B 33/14* (2013.01); *H01L 33/20* (2010.10); *H01L 33/502* (2013.01); *H01L 2224/48091* (2013.01); *H01L 2224/8592* (2013.01); *H01L 2924/3025* (2013.01)
USPC ........... 427/67; 427/385.5; 427/386; 427/387

(58) Field of Classification Search
CPC ...................................... H01L 33/502
USPC ...................................... 427/67, 64
See application file for complete search history.

(56) References Cited

U.S. PATENT DOCUMENTS

| | | | | |
|---|---|---|---|---|
| 4,747,517 | A * | 5/1988 | Hart | 222/137 |
| 6,924,596 | B2 | 8/2005 | Sato et al. | |
| 7,354,785 | B2 * | 4/2008 | Kabay et al. | 438/47 |
| 7,361,417 | B2 | 4/2008 | Kang et al. | |
| 7,371,593 | B2 * | 5/2008 | Harada | 438/26 |
| 7,525,127 | B2 | 4/2009 | Hattori et al. | |
| 7,663,307 | B2 | 2/2010 | Kaneko et al. | |

(Continued)

FOREIGN PATENT DOCUMENTS

| | | |
|---|---|---|
| JP | 7-99345 | 4/1995 |
| JP | 8-78445 | 3/1996 |

(Continued)

*Primary Examiner* — Alex A Rolland
(74) *Attorney, Agent, or Firm* — Oblon, McClelland, Maier & Neustadt, L.L.P.

(57) ABSTRACT

A method of manufacturing a light-emitting device includes disposing a light-emitting element on a supporting member, dispersing a fluorescent substance having a particle diameter of 20 to 45 μm in a material of the light-transmitting member at a concentration of 40 to 60 wt %, dripping raw material for the fluorescent layer on the light-emitting element while lowering the viscosity of the raw material, and thermally curing the coated layer.

20 Claims, 2 Drawing Sheets

(56) References Cited

U.S. PATENT DOCUMENTS

| | | |
|---|---|---|
| 7,781,958 B2 | 8/2010 | Hattori et al. |
| 2003/0132701 A1* | 7/2003 | Sato et al. ............ 313/503 |
| 2003/0214233 A1* | 11/2003 | Takahashi et al. ......... 313/512 |
| 2005/0227393 A1 | 10/2005 | Sato et al. |
| 2005/0261400 A1 | 11/2005 | Yang et al. |
| 2006/0027785 A1* | 2/2006 | Wang et al. ............ 252/301.4 F |
| 2007/0228390 A1 | 10/2007 | Hattori et al. |

FOREIGN PATENT DOCUMENTS

| | | |
|---|---|---|
| JP | 2001-298216 | 10/2001 |
| JP | 2002-170989 | 6/2002 |
| JP | 2004-186488 | 7/2004 |
| JP | 2005-123560 | 5/2005 |
| WO | WO 03/021691 A1 | 3/2003 |
| WO | WO 2004003427 A1 | 1/2004 |

* cited by examiner

METHOD OF MANUFACTURING LIGHT-EMITTING DEVICE WITH FLUORESCENT LAYER

CROSS-REFERENCE TO RELATED APPLICATIONS

This application is a Divisional application of U.S. patent application Ser. No. 11/348,410, filed on Feb. 7, 2006, U.S. Pat. No. 7,932,666, and is based upon and claims the benefit of priority from prior Japanese Patent Application No. 2005-195191, filed Jul. 4, 2005, the entire contents of each of which are incorporated herein by reference.

BACKGROUND OF THE INVENTION

1. Field of the Invention

This invention relates to a method of manufacturing a light-emitting device.

2. Description of the Related Art

A conventional light-emitting device is constructed such that it comprises a light-emitting element such as an LED (light-emitting diode) which is mounted on the bottom of U-shaped cup formed in a portion of a supporting body such as a packaging substrate, and a wavelength conversion member placed in the cup so as to cover the light-emitting element, the wavelength conversion member comprising a light-transmitting material containing a fluorescent substance (phosphor). This wavelength conversion member is manufactured by a process wherein a fluorescent substance is incorporated, at first, in a material for a light-transmitting member such as silicone resin or glass, and the resultant material is then dripped, by using a dispenser, into a recess where a light-emitting element is mounted, the material thus placed in the recess being subsequently thermally cured.

Since the specific gravity of fluorescent substance is several times as high as that of the liquid resin which is not yet thermally cured, most of the fluorescent substance in the resin is caused to densely flocculate and sediment around the LED chip. Although the fluorescent substance located in the vicinity of the surface of the LED chip is capable of effectively absorb the light from the LED chip, most of the fluorescent substance cannot absorb the light from the LED chip but shield the light on the contrary, thus attenuating the energy of light. As a result, the light-emitting output of the light-emitting diode deteriorates. Although it is possible to inhibit the sedimentation of fluorescent substance through the employment of a fluorescent substance of small particle diameter, the light extraction efficiency and light absorption efficiency thereof deteriorates as compared with a fluorescent substance of large particle diameter. Further, if a fluorescent substance of small particle diameter flocculates, the mechanism of scattering the light thereof would increase.

Generally, as the particle diameter of fluorescent substance becomes larger, the light conversion efficiency thereof becomes more excellent. However, since the fluorescent substance becomes more liable to sediment as the particle diameter thereof becomes larger, it is difficult to form a layer of fluorescent substance where the fluorescent substance is uniformly dispersed.

Further, there has been also proposed a light-emitting element where the fluorescent substance is deliberately sedimented. Even in this light-emitting element having such a structure, the fluorescent substance which fails to contribute to the emission of light exists to a great extent. Further, since the emission of light is shielded by this fluorescent substance, the optical output deteriorates. Further, since the distribution in density of fluorescent substance differs depending on the configuration of LED chip and packaging cup as well as the location of wiring, the problem of irregular coloration generates. Unless it is possible to control the dispersibility of fluorescent substance, the optical characteristics such as chromaticity and optical output become non-uniform depending on individual light-emitting device, thus deteriorating the yield in the manufacture of light-emitting device.

Furthermore, since a lot of resin is required to be employed in the conventional coated structure of fluorescent substance, air bubbles are liable to be generated in the package cup, thus giving rise to the generation of irregular coloration or disconnection of wire due to cracking. No one has succeeded as yet to find out a technique to coat a fluorescent substance of large particle diameter with a uniform density distribution.

BRIEF SUMMARY OF THE INVENTION

A method of manufacturing a light-emitting device according to an aspect of the present invention comprises disposing a light-emitting element on a supporting member, dispersing a fluorescent substance having a particle diameter ranging from 20 to 45 μm in a material of a light-transmitting member at a concentration of 40 to 60 wt % to obtain a raw material for a fluorescent layer, dripping the raw material for the fluorescent layer on the light-emitting element while lowering the viscosity of the raw material, thereby forming a coated layer, and thermally curing the coated layer to form a fluorescent layer having a thickness ranging from 80 to 240 μm and having recesses and projections that correspond to an arrangement of the particles of the fluorescent substance at a surface of the fluorescent layer in contact with an external atmosphere.

DETAILED DESCRIPTION OF THE INVENTION

Next, one example of the present invention will be explained with reference to drawings.

Figure 1:
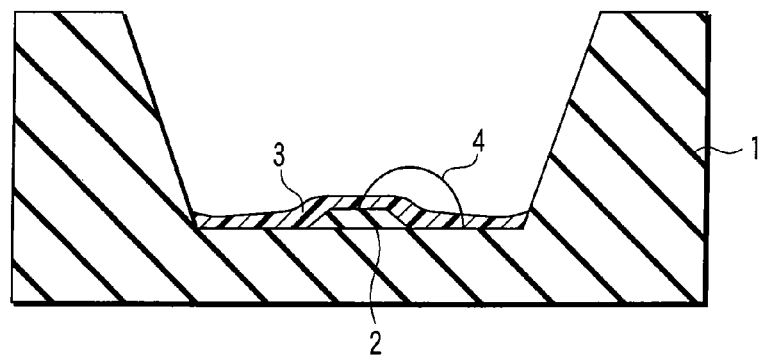
FIG. 1 is a cross-sectional view showing one example of the light-emitting device according to one embodiment of the present invention.

FIG. 1 is a cross-sectional view showing one example of the light-emitting device of the present invention.

The light-emitting device shown in FIG. 1 is a light-emitting diode wherein an LED chip 2 as a light-emitting element is disposed on the bottom of a package cup 1 employed as a supporting member. For example, it is possible to use a vessel as a supporting member. Alternatively, a structure having a light-emitting element or a reflector formed on a substrate can be used as the supporting member. A fluorescent layer 3 made of a light-transmitting member containing a fluorescent substance (not shown) dispersed therein is formed on the LED chip 2. The reference number 4 indicates a bonding wire.

Figure 2:
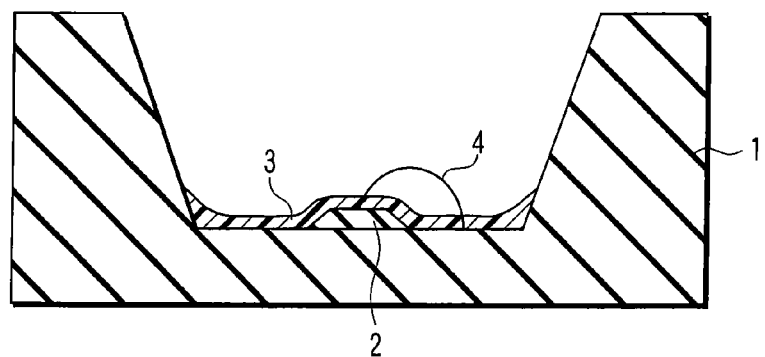
FIG. 2 is a cross-sectional view showing one example of the light-emitting device according to another embodiment of the present invention.
Figure 3:
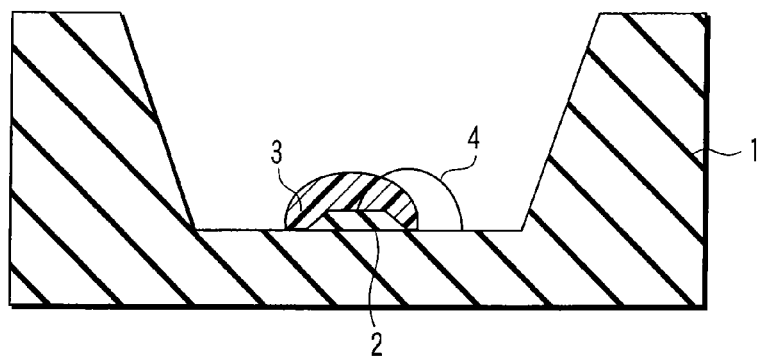
FIG. 3 is a cross-sectional view showing one example of the light-emitting device according to another embodiment of the present invention.

Incidentally, in the example shown in FIG. 1, although the fluorescent layer 3 is mounted simply on the bottom of the recess of the package cup 1 at the same thickness as that of the LED chip 2, the embodiment of the present invention should not be construed as being limited to such a structure. For example, the fluorescent layer 3 may be disposed so as to extend up to the sidewalls of the package cup 1 as shown in FIG. 2. In this case, although it is possible to derive the effect that the reflective plates of the sidewalls can be effectively utilized, the height of the fluorescent layer 3 located on the sidewalls of the package cup 1 should desirably be limited to about 500 μm. Further, as shown in FIG. 3, the fluorescent layer 3 may be disposed only over the LED chip 2. This structure is advantageous in the respect that the configuration of coated layer is not dependent on the structure of package.

As for the LED chip 2, it is possible to employ a material such as a nitride semiconductor which is capable of emitting a light of wavelength which is capable of exciting the fluorescent substance contained in the fluorescent layer 3. In order to emit white light, the emission wavelength of the LED chip should preferably be set to the range of 400 to 550 nm, more preferably to the range of 420 to 490 nm while taking into consideration additive complementary colors between the emission wavelength of the LED chip and the emission wavelength to be derived from the fluorescent substance.

The fluorescent layer 3 is constituted by a light-transmitting member containing a fluorescent substance dispersed therein. As for the light-transmitting member, it is possible to employ, for example, various kinds of resins such as silicone resin, acrylic resin and epoxy resin. Under some circumstances, an insulating adhesive (for example, a light-transmitting inorganic material such as glass) to be employed for fixing an LED chip to the package cup may be employed as a light-transmitting member.

In the light-emitting device according to this embodiment of the present invention, the thickness of fluorescent layer 3 should preferably be confined to range from 80 to 240 μm. When the thickness of the fluorescent layer 3 is less than 80 μm, it would be impossible to secure high light conversion efficiency. On the other hand, if the thickness of fluorescent layer 3 exceeds 240 μm, the light extraction efficiency may be degraded. More preferably, the thickness of fluorescent layer 3 should be confined to the range of 100 to 150 μm.

As for the fluorescent substance, it is possible to employ various kinds of fluorescent substances which are capable of emitting light as they are excited by the light emitted from a semiconductor LED chip. When a blue LED chip and a yellow fluorescent substance are employed in combination, it would be possible to obtain a white light. This yellow fluorescent substance may be mixed with a red fluorescent substance or a yellowish green fluorescent substance, thus making it possible to enhance the color rendering. Further, depending on the kinds of the fluorescent substance, it is possible to employ an LED chip which is capable of emitting ultraviolet rays. The light-emitting device according to one embodiment of the present invention can be applied to optional fluorescent substances which are capable of emitting various emission wavelengths.

As for the fluorescent substance that can be employed in the embodiment of the present invention, following fluorescent substances can be employed.

As for the fluorescent substance which is capable of emitting yellow color, it is possible to employ an yttrium aluminum garnet oxide fluorescent substance containing Y and activated by Ce or Pr, and an europium-activated alkaline earth metal silicate-based fluorescent substance represented by $(Ba, Ca, Sr)_2SiO_4$:Eu.

As for the fluorescent substance which is capable of emitting red color, it is possible to employ a europium-activated alkaline earth metal silicate-based fluorescent substance represented by $(Ba, Ca, Sr)_2SiO_4$:Eu. When part of Sr is substituted by Ba, the emission spectrum can be shifted to short wavelength side, and when part of Sr is substituted by Ca, the emission spectrum can be shifted to long wavelength side. By modifying the composition in this manner, it is possible to continuously adjust the red luminescent color. Further, it is also possible to employ a nitride fluorescent substance containing N, at least one element selected from Be, Mg, Ca, Sr, Ba and Zn, at least one element selected from C, Si, Ge, Sn, Ti, Zr and Hf, and activated with at least one element selected from rare earth elements. Additionally, it is also possible to employ an europium-activated alkaline earth silicon nitride-based fluorescent substance constituted by ruptured particles having red ruptured surfaces, capable of emitting a light of red region and represented by $(Mg, Ca, Sr, Ba)_2Si_5N_8$:Eu, and an europium-activated rare earth oxychalcogenite-based fluorescent substance constituted by grown particles having approximately spherical configuration as a regular crystal growth configuration, capable of emitting a light of red region and represented by $(Y, La, Gd, Lu)_2O_2S$:Eu.

As for the fluorescent substance which is capable of emitting green color, it is possible to employ an europium-activated alkaline earth silicon oxynitride-based fluorescent substance constituted by ruptured particles having ruptured surfaces, capable of emitting a light of green region and represented by $(Mg, Ca, Sr, Ba)Si_2O_2N_2$:Eu, and an europium-activated alkaline earth silicate-based fluorescent substance constituted by ruptured particles having ruptured surfaces, capable of emitting a light of green region and represented by $(Ba, Ca, Sr)_2SiO_4$:Eu.

The aforementioned fluorescent substances can be employed singly or in combination of two or more kinds. Further, it is possible to obtain an optional color tone through a combination of these fluorescent substances with a light-emitting chip. For example, it is possible to obtain a light-emitting device which is capable of emitting white light through a combination of a semiconductor light-emitting element capable of emitting blue color with a yellow fluorescent substance. When this yellow fluorescent substance is replaced by a mixture of a yellow fluorescent substance and a red fluorescent substance in this case, it is possible to obtain a white light of warm color.

When two or more kinds of fluorescent substances are suitably mixed, a light of desired white type color mixture can be obtained. Specifically, when the quantities of plural kinds of fluorescent substances differing in chromaticity points are suitably adjusted in conformity with the emission wavelength of light-emitting chip and incorporated in a light-emitting device, it is possible to enable the light-emitting device to emit at an optional point on a chromaticity diagram that lies on a junction between these fluorescent substances and the light-emitting chip.

In view of the excitation intensity to be effected by a blue light source, it is more preferable to employ, as a yellow fluorescent substance, a silicate compound based on a composition of $(Sr, Ca, Ba)_2SiO_4$:Eu among the aforementioned fluorescent substances. It is also possible to create white light even if other kinds of yellow fluorescent substances such as an yttrium aluminum oxide fluorescent substance, YAG:Ce or sulfide fluorescent substance are employed.

In the light-emitting device according to this embodiment of the present invention, the particle diameter of fluorescent substance to be included in the fluorescent layer should be confined to the range of 20 to 45 μm. The range of 20 to 45 μm in particle diameter in this case means that the particle diameter of fluorescent particles occupying not less than ⅓ of a total number of fluorescent particles existing in an area of 0.04 mm² is distributed within the range of 20 to 45 μm as the fluorescent layer is observed by using a microscope.

When the particle diameter of the fluorescent substance falls outside the aforementioned range, various inconveniences such as a remarkable increase in scattering of light or in sedimentation of fluorescent substance may occur, thus degrading the light conversion efficiency.

Further, the regulation of particle size distribution as described above is effective in preventing irregular coloration. The regulation of particle size distribution can be realized by classification.

The fluorescent substance whose particle size is confined within the aforementioned range is dispersed in the light-transmitting member at a concentration ranging from 40 to 60 wt %. If the concentration of the fluorescent substance is less than 40 wt %, the blue-emitting portion may become too strong so that it would become difficult to obtain a white light. On the other hand, if the concentration of the fluorescent substance exceeds 60 wt %, the emission of light may be shielded by the fluorescent substance. More preferably, the concentration of the fluorescent substance should be confined within the range of 50 to 60 wt %.

The fluorescent layer in the light-emitting device according to one embodiment of the present invention is featured in that it contains a fluorescent substance at a specific concentration and that the particle diameter of the fluorescent substance is confined to a specific range. Further, since the thickness of the fluorescent layer is confined to a specific range, it is possible to further enhance the optical output. Additionally, since the fluorescent substance and the fluorescent layer are regulated as described above, fine recessed/projected portions reflecting the configuration of fluorescent substance are formed on the surface of fluorescent layer in the light-emitting device according to one embodiment of the present invention. Due to the creation of these recessed/projected portions, the light is enabled to effectively diffuse into the interface between the light-transmitting member and the external atmosphere. As a result, it is now possible to prevent the irregular coloration of luminescent color and to secure a uniform emission of light.

The light-emitting device according to one embodiment of the present invention can be manufactured by the following process.

First of all, a fluorescent substance having a particle diameter ranging from 20 to 45 μm is dispersed at a predetermined concentration in the material of light-transmitting member such as silicone resin and epoxy resin, thereby preparing a raw material for the fluorescent layer. The particle diameter of the fluorescent substance is adjusted in advance by classification so as to fall within a predetermined range. The concentration of the fluorescent substance in the raw material for the fluorescent layer is confined within the range of 40 to 60 wt %.

On the other hand, a semiconductor light-emitting element such as an LED chip is mounted in a recess of a package cup according to the conventional method, and is then electrically connected with electrodes by using a bonding wire.

Subsequently, the raw material for the fluorescent layer is heated and dripped onto the LED chip mounted on the package cup by using a dispenser, thereby forming a coated film.

In this case, the LED chip or the package cup may be heated to decrease the viscosity of the raw material for the fluorescent layer.

The heating temperature can be suitably selected depending on the curing temperature of the light-transmitting member. This heating step is required to be continued until at least the raw material for the fluorescent layer is heated up to the curing temperature thereof. For example, when silicone resin is employed as a material for the light-transmitting member, the raw material for the fluorescent layer should preferably be heated up to 150° C. or more.

In the step of coating the raw material for the fluorescent layer, the quantity of the raw material is adjusted enabling the raw material to be dripped little by little so as to control the thickness of the fluorescent layer after the curing thereof to range from 80 to 240 μm. Since the specific gravity of fluorescent substance is larger than that of the light-transmitting member such as a liquid resin, the fluorescent substance tends to aggregate and sediment. Therefore, in order to prevent the sedimentation of fluorescent substance and to obtain a fluorescent layer where the fluorescent substance is uniformly dispersed therein, the quantity of raw material for the fluorescent layer to be dripped should desirably be as little as possible.

Incidentally, by modifying the quantity to be dripped of the raw material for the fluorescent layer, it is possible to obtain various configurations of the fluorescent layer as shown in FIGS. 1 to 3.

Subsequently, the resultant package cup is placed in an oven for example and the light-transmitting member is heated and cured for 30 minutes to 3 hours at a temperature of 80-200° C. If the fluorescent substance flocculates around the LED chip, the optical output would degrade. Therefore, in order to prevent this flocculation, the light-transmitting member is required to be cured immediately after the dripping of the raw material. When the light-transmitting member is cured in this manner, it is possible to form a fluorescent layer wherein a fluorescent substance is dispersed around the LED chip without causing the particles of fluorescent substance to superimpose with each other, thus preventing the optical output from being degraded.

The conditions for the heat curing of the light-transmitting member can be suitably selected depending on the heat curing temperature of the light-transmitting member. For example, when silicone resin is employed as a light-transmitting member, it can be cured by heating it for 30 minutes to 3 hours at a temperature of 80-200° C.

In this manner, it is possible to obtain a light-transmitting device according to one embodiment of the present invention.

Next, specific examples of the present invention will be described as follows.

Example 1

A yellow fluorescent substance having a composition represented by $(Sr_{1.84}Ba_{0.12})SiO_4:Eu$ was prepared as a fluorescent substance. As for the raw material for the light-transmitting member, silicone resin was prepared. The particle diameter of the fluorescent substance employed herein was confined to the range of 20 to 45 μm. The range of particle diameter was determined from the range of distribution of at least ⅓ of fluorescent particles as the number of the fluorescent particles in an area of 0.04 mm² was observed by a microscope. Namely, the range of 20 to 45 μm in particle diameter in this case means that the particle diameter of fluorescent particles occupying not less than ⅓ of a total number of fluorescent particles existing in an area of 0.04 mm² was distributed within the range of 20 to 45 μm as the fluorescent layer was observed by using a microscope. In the following examples also, a fluorescent substance having the same particle diameter as described above was employed. This fluorescent substance was dispersed in the silicone resin at a concentration of 40 wt %, thus obtaining a raw material for the fluorescent layer.

On the other hand, a GaN-based blue LED having an emission layer made of InGaN, etc. was prepared as an LED chip and mounted on the bottom of package cup. The electrodes of the LED chip were connected with the electrodes provided on the package cup by using a bonding wire, thus manufacturing a light-emitting device.

Figure 4:
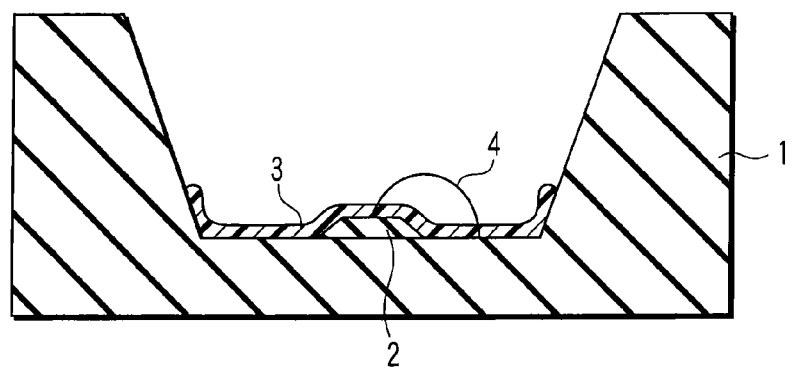
FIG. 4 is a cross-sectional view showing the light-emitting device that has been manufactured in one example of the present invention.

While being heated, the raw material for the fluorescent layer was then coated on the LED chip by using a dispenser. Then, the package cup was immediately placed in an oven and left therein for three hours at a temperature of 150° C., thus accomplishing the light-emitting device of this example. When a cross-section of the light-emitting device thus obtained was observed by a microscope, the fluorescent layer 3 was found disposed entirely covering the LED chip 2 as shown in FIG. 4. The thickness of the fluorescent layer 3 on the top surface and sidewalls of LED chip 2 was all about 120 μm.

As shown in FIG. 4, the fluorescent layer 3 was also deposited also on the bottom of the recess of package cup 1 at the same thickness as described above. Further, the sidewalls of the recess of package cup 1 were also covered up to a height of 500 μm by the fluorescent layer 3 having the same thickness as described above.

Figure 5:
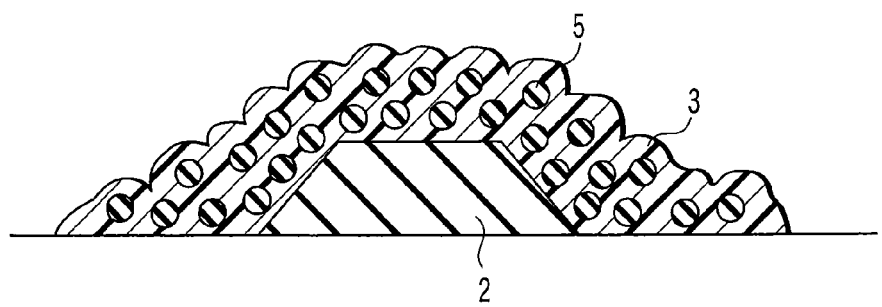
FIG. 5 is an enlarged cross-sectional view of the fluorescent layer.

The fluorescent layer 3 disposed over the LED chip 2 was observed by a microscope, the results of observation being shown in an enlarged view of FIG. 5. As shown in FIG. 5, the particles 5 of the fluorescent substance were deposited as a 2-ply layer with the light-transmitting member being interposed between the particles 5 of the fluorescent substance. The surface of the fluorescent layer 3 was formed to have a fine recessed/projected surface reflecting the configuration of the particles 5 of the fluorescent substance.

A raw material for the fluorescent layer was prepared in the same manner as described above except that the particle diameter of the fluorescent substance was changed to the range of 10 to 19 μm and the concentration of the fluorescent substance was changed to 61 wt %. As already explained above, the range of 10 to 19 μm in particle diameter in this case means that the particle diameter of fluorescent particles occupying not less than ⅓ of a total number of fluorescent particles existing in an area of 0.04 mm² was distributed within the range of 10 to 19 μm as the fluorescent layer was observed by using a microscope. The particle diameter of the fluorescent substance was adjusted by classification. By using this raw material for the fluorescent layer, a fluorescent layer having a thickness of 60 μm was formed on the LED chip disposed in the package cup having the same configuration as described above, thus manufacturing the light-emitting device of Comparative Example 1. The height of the fluorescent layer was adjusted by using the dispenser.

Then, the optical output of each of these light-emitting devices of Example 1 and Comparative Example 1 was measured by a light flux measuring apparatus. As a result, the optical output of the light-emitting device of Example 1 was found as high as 1.9 as compared with that of the light-emitting device of Comparative Example 1, the optical output of which being defined as being 1.

Incidentally, it was confirmed, from the measurement of the distribution of light, that it was possible to obtain a uniform light emission from the light-emitting device of Example 1. Whereas, the emission of light from the light-emitting device of Comparative Example 1 was non-uniform.

Further, various kinds of light-emitting devices were manufactured by changing not only the particle diameter and concentration of the fluorescent substance but also the thickness of the fluorescent layer. Then, the optical output of these light-emitting devices was measured, the results being summarized in the following Tables 1 and 2.

TABLE 1

| Examples | Particle diameter (μm) | Concentration (wt %) | Thickness (μm) | Relative output |
|---|---|---|---|---|
| 1 | 20-45 | 40 | 120 | 1.9 |
| 2 | 20-45 | 50 | 130 | 2.3 |
| 3 | 20-45 | 60 | 200 | 2.0 |
| 4 | 20-45 | 50 | 100 | 2.2 |
| 5 | 20-45 | 50 | 150 | 2.3 |
| 6 | 20-45 | 60 | 160 | 1.9 |
| 7 | 20-45 | 60 | 80 | 1.8 |
| 8 | 20-45 | 60 | 240 | 1.9 |

TABLE 2

| Comparative Examples | Particle diameter (μm) | Concentration (wt %) | Thickness (μm) | Relative output |
|---|---|---|---|---|
| 1 | 10-19 | 61 | 60 | 1.0 |
| 2 | 10-19 | 40 | 260 | 1.0 |
| 3 | 10-19 | 60 | 200 | 1.0 |
| 4 | 46-75 | 39 | 240 | 0.9 |
| 5 | 20-45 | 39 | 240 | 0.9 |
| 6 | 20-45 | 40 | 60 | 1.0 |
| 7 | 20-45 | 39 | 260 | 0.9 |

Then, various kinds of light-emitting devices were manufactured in the same manner as described above except that the fluorescent substance was changed to $(Y, Gd)_3(Al, Gd)_5O_{12}:Ce$. Then, the optical output of these light-emitting devices was measured, the results being summarized in the following Table 3.

TABLE 3

| Examples | Particle diameter (μm) | Concentration (wt %) | Thickness (μm) | Relative output |
|---|---|---|---|---|
| 9 | 20-45 | 40 | 120 | 1.6 |
| 10 | 20-45 | 50 | 130 | 2.0 |
| 11 | 20-45 | 60 | 200 | 1.8 |
| 12 | 20-45 | 50 | 100 | 1.9 |
| 13 | 20-45 | 50 | 150 | 2.1 |
| 14 | 20-45 | 60 | 160 | 1.7 |
| 15 | 20-45 | 60 | 80 | 1.6 |
| 16 | 20-45 | 60 | 240 | 1.7 |

Further, various kinds of light-emitting devices were manufactured in the same manner as described above except that the raw material for light-transmitting member was changed to epoxy resin. Then, the optical output of these light-emitting devices was measured, the results being summarized in the following Table 4.

TABLE 4

| Examples | Particle diameter (μm) | Concentration (wt %) | Thickness (μm) | Relative output |
|---|---|---|---|---|
| 17 | 20-45 | 40 | 120 | 1.9 |
| 18 | 20-45 | 50 | 130 | 2.3 |
| 19 | 20-45 | 60 | 200 | 2.0 |
| 20 | 20-45 | 50 | 100 | 2.2 |
| 21 | 20-45 | 50 | 150 | 2.3 |
| 22 | 20-45 | 60 | 160 | 1.9 |
| 23 | 20-45 | 60 | 80 | 1.8 |
| 24 | 20-45 | 60 | 240 | 1.9 |

It will be clear from above Tables that the light-emitting devices according to Examples of the present invention were all capable of emitting light at a high relative output. Especially, as shown in Table 1, in the case of the light-emitting device of Example 5 where the fluorescent layer was formed to a film thickness of 150 μm by using a fluorescent substance having a particle diameter ranging from 20 to 45 μm at a concentration of 50 wt %, it was possible to enhance the relative optical output up to 2.3.

According to the embodiment of the present invention, it is possible to provide a light-emitting device which is capable of emitting a uniform light at a high optical output and to provide a method of manufacturing such a light-emitting device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a light-emitting device comprising:
   disposing an LED chip on a supporting member;
   dispersing a fluorescent substance having a particle diameter ranging from 20 to 45 μM in a material of a light-transmitting member at a concentration of 40 to 60 wt % to obtain a raw material for a fluorescent layer;
   dripping the raw material for the fluorescent layer on the LED chip while lowering the viscosity of the raw material, thereby forming a coated layer; and
   thermally curing the coated layer to form the fluorescent layer having a thickness ranging from 80 to 240 μm,
   wherein a surface of the fluorescent layer is in contact with an external atmosphere and has recesses and projections that correspond to an arrangement of the particles of the fluorescent substance.

2. The method according to claim 1, wherein a GaN-based blue LED is employed as the LED chip.

3. The method according to claim 2, wherein the fluorescent substance is selected from the group consisting of an yttrium aluminum garnet oxide fluorescent substance containing Y and activated by Ce or Pr, and an europium-activated alkaline earth metal silicate-based fluorescent substance represented by $(Ba, Ca, Sr)_2SiO_4:Eu$.

4. The method according to claim 3, further comprising mixing a red fluorescent substance in the raw material for the fluorescent layer.

5. The method according to claim 3, further comprising mixing a yellowish green fluorescent substance in the raw material for the fluorescent layer.

6. The method according to claim 1, wherein an LED chip which emits ultraviolet rays is employed as the LED chip.

7. The method according to claim 1, wherein the fluorescent layer is formed with a thickness ranging from 100 to 150 μm.

8. The method according to claim 1, wherein the fluorescent substance is contained in the fluorescent layer at a concentration from 50 to 60 wt %.

9. The method according to claim 1, wherein an insulating adhesive is employed as the light-transmitting member.

10. The method according to claim 1, wherein the lowering of the viscosity of the raw material is performed by heating the LED chip or the supporting member.

11. The method according to claim 1, wherein a resin selected from the group consisting of silicone resin, acrylic resin and epoxy resin is employed as the light-transmitting member.

12. The method according to claim 11, wherein silicone resin is employed as the light-transmitting member.

13. The method according to claim 12, wherein the lowering of the viscosity of the raw material is performed by heating the raw material.

14. The method according to claim 13, wherein the raw material is heated up to 150° C. or more.

15. The method according to claim 13, wherein the thermally curing the coated layer is performed for 30 minutes to 3 hours at a temperature ranging from 80° C. to 200° C.

16. The method according to claim 1, wherein a package cup having a recess is employed as the supporting member.

17. The method according to claim 16, wherein the fluorescent layer is mounted on a bottom of the recess of the package cup at the same thickness as that of the LED chip.

18. The method according to claim 16, wherein the fluorescent layer is disposed so as to extend up to the sidewalls of the package cup.

19. The method according to claim 16, wherein the height of the fluorescent layer on the sidewalls of the package cup is 500 μm or less.

20. The method according to claim 16, wherein the fluorescent layer is disposed only over the LED chip.

* * * * *